United States Patent [19]

Bierhoff

[11] Patent Number: 4,568,887

[45] Date of Patent: Feb. 4, 1986

[54] APPARATUS FOR SYNCHRONIZING THE OUTPUT FREQUENCY OF A CLOCK OSCILLATOR TO A DATA SIGNAL

[75] Inventor: Martinus P. M. Bierhoff, Eindhoven, Netherlands

[73] Assignee: U.S. Philips Corporation, New York, N.Y.

[21] Appl. No.: 578,461

[22] Filed: Feb. 9, 1984

[30] Foreign Application Priority Data

Oct. 17, 1983 [NL] Netherlands ............... 8303561

[51] Int. Cl.$^4$ .................................... H03L 7/00
[52] U.S. Cl. ..................................... 331/1 R; 331/34; 328/134; 328/155
[58] Field of Search .............. 331/1 R, 17, 34, 1 A; 328/14, 25, 55, 66, 155, 134

[56] References Cited

U.S. PATENT DOCUMENTS 4,309,662  1/1982  Baudoux .................. 328/134 X

Primary Examiner—Eugene R. LaRoche
Assistant Examiner—Robert J. Pascal
Attorney, Agent, or Firm—Thomas A. Briody; William J. Streeter; Marianne Rich

[57] ABSTRACT

The clock signal output of an oscillator is synchronized to the frequency of a data signal by detecting the phase difference between the two signals. The control signal signifying the difference is quantized into a number of standard units and a remainder. The remainder is accumulated and, when it is equal to a standard unit, added to the number signal signifying the number of standard units. The frequency of a fixed frequency oscillator is then adjusted in a direction tending to nullify the number signal.

7 Claims, 5 Drawing Figures

4,568,887

APPARATUS FOR SYNCHRONIZING THE OUTPUT FREQUENCY OF A CLOCK OSCILLATOR TO A DATA SIGNAL

BACKGROUND OF THE INVENTION

1. Field of the Invention

The invention relates to a controlled oscillator circuit having an input for receiving a control signal and an output for supplying a clock signal.

2. Description of the Prior Art

Such an oscillator is employed in, inter alia phase-locked loops. For some uses, such as the reproduction of digital information from a record carrier, in particular an optically readable record carrier for "compact-disc digital audio", the oscillator must be locked to the channel-bit frequency of the reproduced signal and must be capable of following variations of said channel bit frequency in a sufficiently rapid and accurate manner. For the large-scale integration of components it may then be advantageous if this controlled oscillator circuit can be constructed largely in digital technology.

SUMMARY OF THE INVENTION

It is the object of the invention to provide such a controlled oscillator circuit and the invention is characterized by a rounding circuit for generating a signal which is a measure of a number of predetermined units with which the control signal can be approximated and a remainder signal which is a measure of the difference between the control signal and the approximated value, an accumulator for accumulating the remainder signal in synchronism with the clock signal and, when said accumulated remainder-signal exceeds one unit, correcting the output signal of the rounding circuit by one unit, and a tuning-control circuit for changing the tuning of the oscillator circuit in unit steps as a function of the output signal of the rounding circuit.

With respect to the tuning-control circuit the oscillator circuit in accordance with the invention may be further characterized in that the tuning-control circuit is a divider with a variable divisor which is adjusted in conformity with the output signal of the rounding circuit.

An alternative to this oscillator circuit with respect to said tuning-control circuit may be characterized in that the tuning-control circuit comprises a variable delay network, which alternative has the advantage that lower frequencies and consequently a slower logic may be employed.

In this embodiment it is advantageous if the variable delay network comprises a plurality of n delay networks with a delay time $\tau$ which are arranged in series in the output circuit of an oscillator operating with a fixed frequency fo, $(n+1)\tau$ being equal to one period of the frequency fo, and the output is connectable to outputs of the delay networks as a function of the output signal of the rounding circuit in such a manner that switching is possible from the output of the last delay network to the input of the first delay network.

In order to allow use of delay networks which do not comply with stringent accuracy requirements this embodiment may be further characterized in that there is provided a phase-comparator circuit for comparing the phase of the signal, on two points in the chain of delay networks and the delay networks are adjustable by said phase-comparator circuit in such a manner that the phase shift corresponding to a time delay $\tau$ at the frequency fo is $360/(n+1)°$.

In order to allow a simple phase comparison it is advantageous that an additional delay network with a time delay $\tau$ is arranged in the chain of delay networks in series with the chain of n delay networks and the phase-comparison circuit controls the overall phase variation of all n+1 networks in such a manner that it is equal to 360°.

For coupling out an output signal this embodiment may be characterized in that the circuit comprises a (n+1)-position switch whose (n+1) inputs are connected to (n+1) terminals of the delay networks in a cyclic sequence, which terminals are connected to the input of the first of the n networks and the outputs of all n networks in a cyclic sequence and the output is connected to the output of the controlled oscillator circuit, and the output signal of the rounding circuit controls the switch via a counter with n+1 positions, which counter is operated cyclically, the count of said counter determining which of the n+1 terminals is connected to the output of the controlled oscillator circuit by said switch.

BRIEF DESCRIPTION OF THE DRAWINGS

The invention will now be described in more detail, by way of example, with reference to the drawings, in which.

DESCRIPTION OF THE PREFERRED EMBODIMENTS

Figure 1:
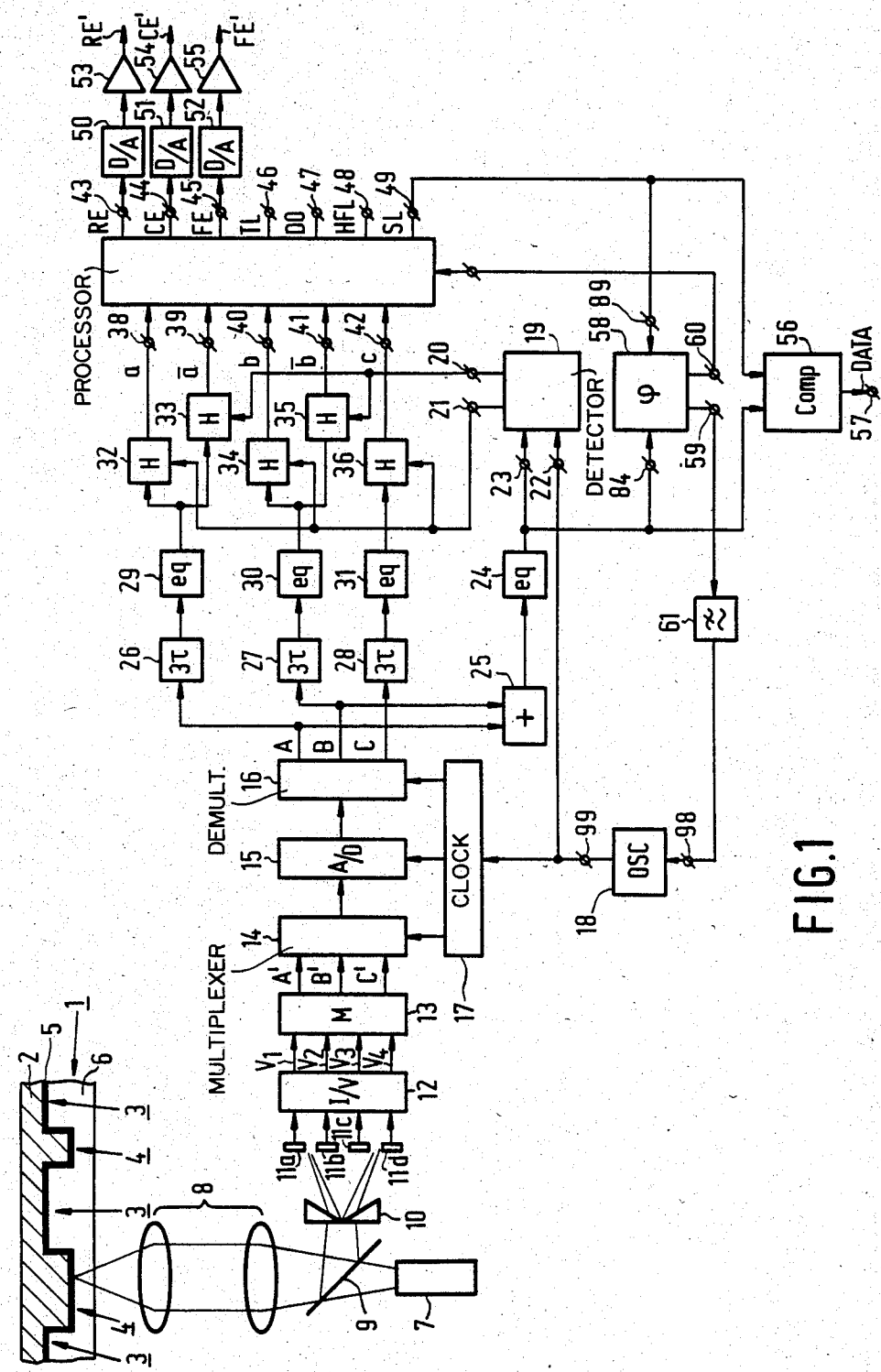
FIG. 1 is the block diagram of an apparatus to which the steps in accordance with the invention may be applied.

FIG. 1 shows an apparatus in accordance with the invention. In this figure a disc-shaped record carrier 1 is shown in a schematic cross-sectional view. This record carrier comprises a substrate 2 in which a track structure is formed, which structure comprises grooves 3 and intermediate areas 4. This relief type track structure is coated with a reflecting layer 5 and a transparent protective layer 6. The information contained in the relief-type track structure is read by a laser beam generated by a laser 7. The beam is projected and focused on the tracks by a lens system 8, the reflected beam being projected on an in-line array of four optical detectors 11a, 11b, 11c and 11d by a semi-transparent mirror 9 and a beam splitter 10. The currents supplied by these photodetectors are converted into the signal voltages $V_1$, $V_2$, $V_3$ and $V_4$ by means of a current-voltage converter 12.

For correct read-out the focusing of the lens system 8 is controlled in a manner, not shown, by means of a focusing control signal FE'. For radial tracking the radial location of the spot produced by the laser beam is controlled by means of a radial control signal RE'. This is a fine-control system. Coarse control is obtained (in a manner not shown) by moving the entire optical system 7, 8, 9, 10, 11 in a radial direction under command of a control signal CE'.

The control signals CE', RE' and FE' are derived from the signal voltages $V_1$, $V_2$, $V_3$ and $V_4$. In addition to the sum $V_1+V_2+V_3+V_4$ required for recovering the high-frequency data signal, the signal $(V_1+V_4)-(V_2+V_3)$ is required for the signal FE' and the signal $(V_1+V_2)-(V_3+V_4)$ is required for the signal CE' and the signal RE'. All these control signals can be derived from three signals A', B' and C' which are obtained by combining the signals $V_1$, $V_2$, $V_3$ and $V_4$. In the present embodiment these signals are related as follows:

$$A' = V_1 + V_2$$

$$B' = V_3 + V_4$$

$$C' = V_1 + V_4.$$

The combination of the signals $V_1$, $V_2$, $V_3$ and $V_4$ described in the foregoing is obtained by means of a matrix 13. This combination has the advantage that only three instead of four signals must be digitized, so that a local lower clock frequency is required than in the case that these signals are digitized serially. For this purpose the signals A', B' and C' are converted into serial form by means of a multiplexer 14, they are digitized in an analog-to-digital converter 15 and they are reconverted into parallel form to obtain the corresponding digital samples A, B and C by means of a demultiplexer 16. The multiplexer 14, the analog-to-digital converter 15 and the demultiplexer 16 receive clock signals from a clock-signal generating circuit 17, which supplies the required clock signals in the correct phase relationship under control of an oscillator 18, in such a manner that the samples A, B and C are supplied in synchronism with the bit frequency of the data signal.

For generating the various control signals it is important to suppress the data-signal spectrum as far as possible. This is achieved by selecting samples in synchronism with the data pattern (pits and intermediate areas), so that the instantaneous sampling frequency becomes equal to the instantaneous frequency of the data signal. For this purpose one sample for each pit (3) and for each intermediate area (4) is selected from each of the samples A, B and C and, in order to minimize the effect of the optical transfer function of the read-out (the signal amplitude is a function of the location of the projected laser beam relative to the pits and decreases towards the edges of the pits), the samples are taken only for pits and intermediate areas which are longer than a specific number of clock periods, in the present example longer than 5 clock periods. For this purpose a detector 19 (which will be described in more detail with reference to FIG. 2) generates a pulse on an output 20 when the sixth sample in one pit is detected and a pulse on output 21 when the sixth sample in one intermediate area is detected. The detector 19 receives the clock signals from the oscillator 18 on an input 22 and the digital sum of the signals A and B, obtained by means of the adder 25 and equalized by means of the circuit 24, on an input 23.

The samples A, B and C are each delayed by three clock periods ($\tau$) of the oscillator 18 by means of delay networks 26, 27 and 28 respectively, are equalized by means of the equalizers 29, 30 and 31 respectively, and are applied to hold circuits 32 and 33, 34 and 35, and 36 respectively. The hold circuits 32, 34 and 36 are clocked by the signal on output 21 of the detector 19 and the hold circuits 33 and 34 by the signal on output 20. During each intermediate area longer than five periods the third samples a, b and c of the samples A, B and C respectively then appear on outputs 38, 40 and 42 respectively of hold circuits 32, 34 and 36 respectively and during each pit which is longer than five clock periods the third samples a and b of the samples A and B respectively then appear on the outputs 39 and 41 respectively of the hold circuits 33 and 35 respectively.

The signals a, $\bar{a}$, b, $\bar{b}$ and c are applied to a processing circuit 37 (which is described in more detail with reference to FIG. 4), which supplies the signals RE, CE and FE on outputs 43, 44 and 45 respectively, and a signal TL representing a loss of track, a signal DO indicating a signal drop-out, a signal HFL indicating that the level of the high-frequency data signal is too low, and a signal SL which is a decision level for data-signal processing, on outputs 46, 47, 48, and 49, respectively. The signals RE, CE and FE are converted into analog signals by digital-to-analog converters 50, 51 and 52 and subsequently they are amplified by amplifier 53, 54 and 55 to form the analog control signals RE', CE' and FE' for focusing and tracking control.

The sum of the signals A+B formed by means of the adder 25 and the equalizer 24 is not only applied to a detector 19 but also to a comparator 56 which also receives the decision level SL for restoring the digital data signal and applying it to an output 57 and to a phase comparator circuit 58, which compares the phase of the samples A+B with the phase of the data signal on the record carrier 1 and which supplies a signal which is a measure of this phase difference to an output 59 and a signal which is a measure of the asymmetry of the signal A+B to an output 60, which last-mentioned signal is applied to processing circuit 37. The phase-error signal on output 39 controls the oscillator 18 by a low-pass filter 61.

Figure 2:
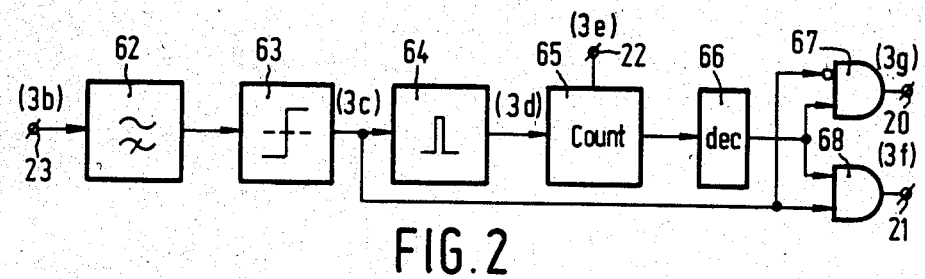
FIG. 2 shows an example of the detector 19 in the apparatus shown in FIG. 1.
Figure 3:
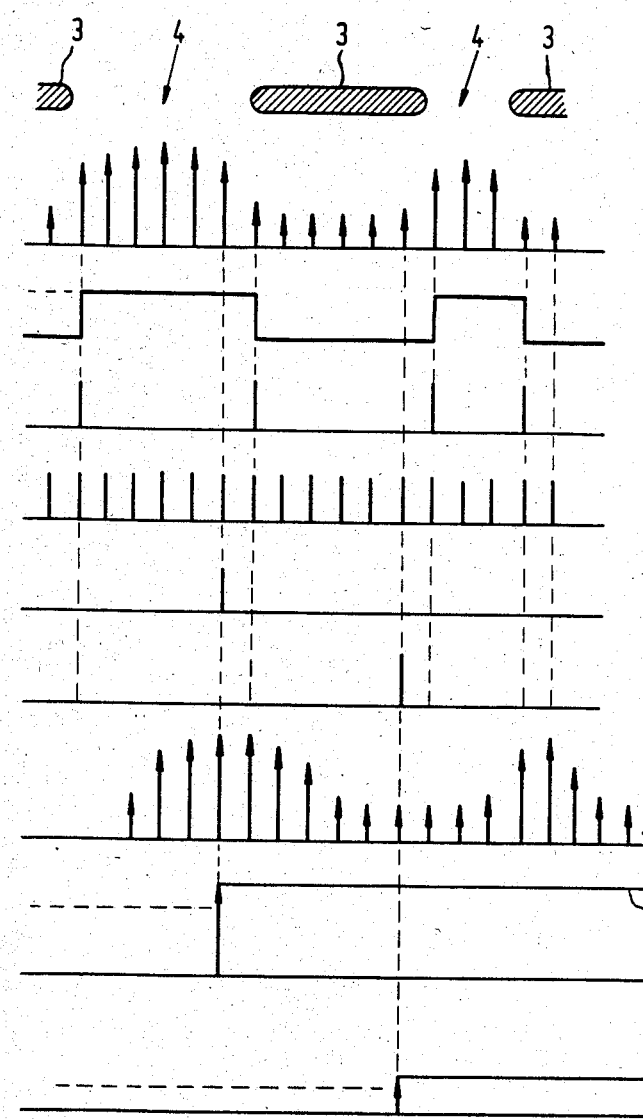
FIG. 3 shows some diagrams to explain the operation of the detector shown in FIG. 2.

FIG. 2 shows an example of the detector 19 in the apparatus shown in FIG. 1, and FIG. 3 shows some diagrams to explain the operation of the circuit shown in FIG. 2. In the circuit shown in FIG. 2 the signal A+B from the equalizer 24 is applied to a high-pass filter 62 via an input 23 in order to remove the low-frequency components, thereby enabling the digital data signal to be restored by means of a simple comparator 63. The edges of the rectangular data signal are detected by means of a circuit 64, for example a differentiator. This edge detector starts a counter 65 which counts the clock pulses (from the oscillator 18) on its input 22 from the instant defined by the pulses from the edge detector 64. A decoder circuit 66 decodes a specific count, in the present example six. When the count "six" is reached, the pulses are applied to AND-gates 67 and 68. The gate 67 also receives the restored data signal on an inverting input and the gate 68 receives this signal on a non-inverting input. As a result of this, a pulse will appear on output 21 when the count "six" is reached during a positive data signal (3c) and on output 20 when the count "six" is reached during a negative data signal.

To illustrate this, FIG. 3a shows a part of a data track on the record carrier, which track comprises pits 3 and intermediate areas 4 between these pits. FIG. 3b show the samples A+B originating from the track shown in FIG. 3a. FIG. 3c shows the restored data signal after the comparator 63, which is a substantially rectangular signal with a period corresponding to the length of the pits and intermediate areas. FIG. 3d shows the starting pulses for the counter 65 formed on the edges of the data signal, which counter counts the pulses of the clock signal shown in FIG. 3e. The counter 65 supplies a pulse each time that the count "six" is reached and for a positive data signal (FIG. 3c), i.e. during an intermediate area, a pulse will appear on output 21 (FIG. 3f), while for a negative data signal, i.e. during a pit, the pulse will appear on output 20 (FIG. 3g). The signals A, B and C, which have been delayed by three clock periods are thus sampled. FIG. 3h shows the signal A which has been delayed by three clock periods and for which the hold circuit 32 (FIG. 1) holds the third sample from each intermediate area longer than five clock periods (signal shown in FIG. 3i) and the sample and hold circuit 33 holds the third sample from each pit longer than five clock periods (signal shown in FIG. 3j).

In practice it is found that the clock frequency which is locked to the edges of the data signal on the disc is not very stable, but exhibits a variation (jitter) of approximately 50 nsecs. The clock oscillator 18 (FIG. 1) must be capable of accurately keeping in track with this jitter; in practice a tracking accuracy of 10 to 15 nsecs. (for a period of ±200 nsecs) is found to be adequate.

Figure 4:
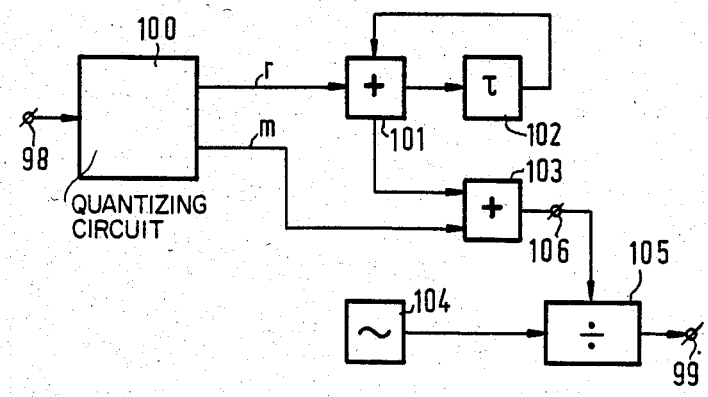
FIG. 4 is an example of the oscillator 18 (FIG. 1) in accordance with the invention, and —

FIG. 4 shows an example of an oscillator circuit 18 having this tracking accuracy. The phase-error signal from the low-pass filter 61 is divided into m steps by means of the rounding circuit 100, which steps correspond to the tracking accuracy of 10 to 15 nsecs. (one step of 10 nsecs for a clock signal with a period of 200 nsecs. corresponds to a phase difference of 18°). The remainder r of the division is applied to an adder 101, which is arranged as an accumulator by means of a feedback loop via a delay network 102 with a delay of one clock period $\tau$ (=200 nsecs), so that the rounding errors r are accumulated. Each time the accumulator has stored one complete step, adder 103 adds this step to the output signal m of the rounding circuit 100. The output signal of this adder 103, i.e. the rounded phase error, controls the divisor of a variable divider 105, which divides the output signal of a fixed oscillator 104. As a step of 10 nsecs. for a desired clock signal with a period of approximately 200 nsecs, corresponds to 1/20 of the period of this clock signal, a signal may be used with a frequency of approximately 100 MHz and a divisor which can be varied around the valve 20. On the output 99 of the divider a clock signal is obtained with a period of the order of 200 nsecs. (±5 MHz), which is variable in steps of approximately 10 nsecs.

Figure 5:
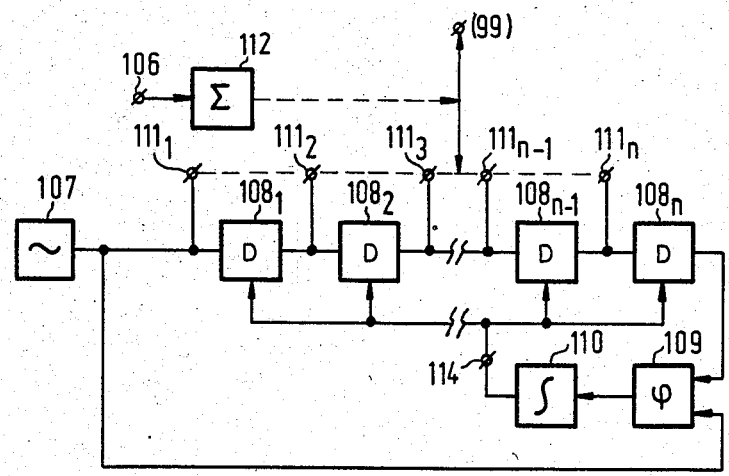
FIG. 5 is a modification to a part of the oscillator shown in FIG. 4.

A modification to the circuit of FIG. 4 will be described with reference to FIG. 5. In this circuit an input 106 receives the phase-error signal which has been rounded in steps (from the adder 103 in the circuit shown in FIG. 4).

The circuit comprises a fixed oscillator 107 which is tuned to approximately the desired frequency (nominal 4.31 MHz). The output signal of this oscillator is passed through n delay networks $108_1$ to $108_n$, which each have a delay equal to the desired step size, i.e. 10 to 15 nsecs. The overall delay of the n networks must correspond to one period of the clock signal, for which purpose the output signal of the last network $108_n$ is compared with the output signal of the oscillator 107 by means of a phase comparator 109. The output signal of the phase comparator 109 controls the delay time of the networks 108 via an integrator 110, so that together these networks provide a delay of exactly one period of the clock signal. For the delay networks 108 taps $111_1$ to $111_n$ are provided. The rounded phase-error signal on input 106 is applied to an accumulator 112, which, via a multiplexer 113 connects output 99 to one of the taps 111 depending on the contents of this accumulator. After every n counting steps the accumulator 112 is reset to its initial state. Therefore, it is advantageous to select n=16, so that a four-bit counter may be used.

Depending on the magnitude of the phase error one of the taps 111 is selected by the accumulator 112. In the case of a progressive phase difference (i.e. an inequality between the desired clock frequency on output 99 and the frequency of the oscillator 107) output 99 will scan taps 111 via multiplexer 113 depending on the phase error and consequently on the frequency difference and steps start again after every n, which will not give rise to a discontinuity because n steps exactly correspond to one period of the output signal. The phase and frequency of the signal on output 99 is consequently the result of phase modulation of the signal from oscillator 107, which phase modulation is effected in discrete steps of 360/n°.

What is claimed is:

1. Controlled oscillator circuit having an input for receiving a control signal and an output for supplying a clock signal, comprising
    means for receiving said control signal, dividing said control signal into a number of predetermined unit values and generating a number signal signifying the number of said unit values and a remainder signal signifying the difference between said control signal and said number of predetermined unit values;
    accumulator means connected to said receiving and dividing means for accumulating said remainder and generating an accumulated remainder signal when the so-accumulated remainder exceeds said unit value;
    correction means connected to said accumulator means and said dividing means for correcting said number signal by said accumulated remainder signal upon receipt of said accumulated remainder signal, thereby furnishing a corrected number signal; and
    tuning-control circuit means connected to said correction means for changing the frequency of said clock signal in unit steps in correspondence to said corrected number signal.

2. A controlled oscillator circuit as claimed in claim 1, wherein said tuning-control circuit means comprises divider means having a variable divisor adjusted in accordance with said corrected number signal.

3. A controlled oscillator as claimed in claim 1, wherein said tuning-control circuit means comprises a variable delay network.

4. A controlled oscillator circuit as claimed in claim 3, wherein said variable delay network comprises oscillator means operating at a fixed frequency fo corresponding to a period $t_o$, a plurality of n delay networks connected to said oscillator means each creating an individual delay time and together furnishing a maximum delay equal to said period $t_o$; and
    further comprising means for selectively connecting said output of said controlled oscillator circuit to one of said delay networks under control of with said corrected number signal.

5. A controlled oscillator circuit as claimed in claim 4, further comprising a phase-comparator means for comparing the phase of the signals at two points in the chain of delay networks and the delay networks are adjustable by said phase comparator circuit in such a manner that the phase shift corresponding to a time delay $\tau$ at the frequency fo is $360/(n+1)°$.

6. A controlled oscillator circuit as claimed in claim 5, further comprising an additional delay network having an additional time delay connected in series with said n delay networks; and wherein said phase comparator circuit controls the phase of said delay networks so that the overall phase shift of all of said delay networks is equal to 360°.

7. A controlled oscillator circuit as claimed in claim 4, wherein said means for selectively connecting said output of said controlled oscillator circuit to said plurality of delay networks comprises a multi-position switch.

* * * * *